United States Patent [19]
Fang et al.

[11] Patent Number: 5,703,909
[45] Date of Patent: Dec. 30, 1997

[54] PROGRAMMABLE VOLTAGE CONTROLLED ATTENUATOR

[75] Inventors: Yi Fang, North Richland Hills, Tex.; Cesar Carralero, Hialeah, Fla.; Mark McEwen, Roanoke, Tex.

[73] Assignee: Motorola, Inc., Schaumburg, Ill.

[21] Appl. No.: 698,837

[22] Filed: Aug. 16, 1996

Related U.S. Application Data

[62] Division of Ser. No. 380,271, Jan. 30, 1995, Pat. No. 5,586,146.

[51] Int. Cl.$^6$ ............................................. H04L 27/04
[52] U.S. Cl. ........................................ 375/295; 375/297
[58] Field of Search ............................. 375/297, 295, 375/308; 330/254; 332/103; 327/307; 370/335, 342

[56] References Cited

U.S. PATENT DOCUMENTS

| | | | |
|---|---|---|---|
| 3,612,890 | 10/1971 | Cornyn, Jr. et al. | 250/222 |
| 4,823,093 | 4/1989 | Frey | 330/254 |
| 5,387,877 | 2/1995 | Robinson | 330/254 |
| 5,559,471 | 9/1996 | Black | 330/277 |

OTHER PUBLICATIONS

Grebene, Alan B., John Wiley & Sons, *BiPolar and MOS Analog Integrated Circuit Design*, pp. 442–450, 1984.

*Primary Examiner*—Tesfaldet Bocure
*Attorney, Agent, or Firm*—John G. Rauch

[57] ABSTRACT

A programmable voltage controlled attenuator (100) meets the dynamic range and gain requirements for various communication protocols using a single bias generator circuit (104). A control voltage input, Vcnt, and a slope select input provide the dynamic range and attenuation for a voltage controlled attenuator (VCA) (109.).

9 Claims, 3 Drawing Sheets

PROGRAMMABLE VOLTAGE CONTROLLED ATTENUATOR

This is a division of application Ser. No. 08/380,271, filed on Jan. 30, 1995 now U.S. Pat. No. 5,586,146.

TECHNICAL FIELD

This invention relates in general to electronic gain control circuits and more specifically to the gain control and dynamic range control of monolithic voltage controlled attenuator (VCA) circuits.

BACKGROUND

In a number of applications utilizing wideband amplifiers, it is often desirable to control the gain of the amplifier electronically, without affecting any other performance parameter. This type of electronic gain control is particularly useful in communication circuits, such as radio-frequency (RF) amplifiers, to improve the signal handling capability or the dynamic range of the amplifier. The electronic gain control capability allows the amplifier gain to be controlled by an automatic gain control (AGC) loop.

With the advancements made in the realm of wireless personal communications systems (PCS), a multitude of communication protocols have been established. Examples of these protocols include digital European cordless telephone (DECT), public access communication system (PACS) protocol, personal handy phone (PHP), and code division multiple access (CDMA). These protocols in turn use a variety of modulation schemes such as quadrature phase shift keyed (QPSK) modulation for CDMA, gaussian frequency shift keyed (GFSK) modulation for DECT, and pi/4 quadrature phase shift keyed (pi/4 QPSK) modulation for PACS and PHP. In order to bring PCS products to market quickly and efficiently there has been an increasing interest in combining as many radio functions as possible into common integrated circuits. This allows the overall cost of theses products to decrease while creating a more synergistic approach to the communications market. The result has been an increased demand for common chip sets that satisfy the requirements of various communication protocols. However, issues arise when trying to meet multiple specification requirements within a single integrated circuit (IC). Such an issue exists between the dynamic range requirements of amplifier drivers known as voltage controlled attenuator (VCA) circuits and the slope of these VCA circuits.

Two important parameters of a VCA circuit are its automatic gain control (AGC) range and its slope. The CDMA protocol requires at least 60 dB of dynamic range while the PACS protocol requires an attenuation slope of 40 dB/volt. These two protocol requirements contradict each other. The problem is further complicated when a digital to analog converter (DAC), which has a predetermined resolution is used to control the attenuation of the VCA.

Accordingly, there is a need for a VCA circuit that satisfies the protocol requirements for both dynamic range and slope of various protocols within a single integrated circuit.

DETAILED DESCRIPTION OF THE PREFERRED EMBODIMENT

Figure 1:
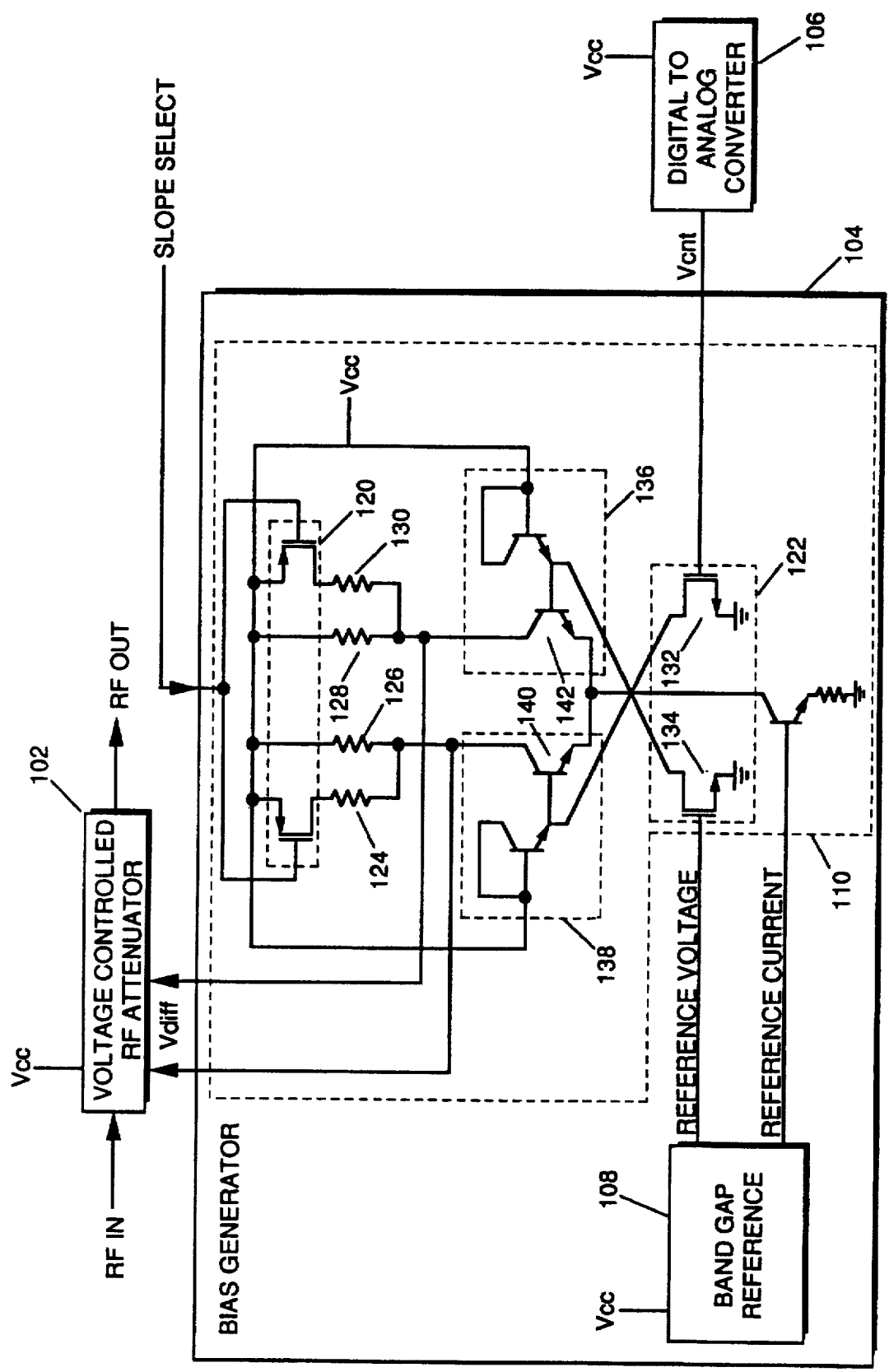
FIG. 1 is a block diagram of a programmable voltage controlled attenuator circuit in accordance with the present invention.

Referring now to FIG. 1, there is shown a programmable voltage controlled attenuator circuit 100 in accordance with the preferred embodiment of the invention. The programmable VCA circuit 100 is preferably fed with an RF signal generated from the output of an in phase quadrature (I/Q) modulator (not shown). I/Q modulators can be used in a variety of modulation schemes, such as pi/4 QPSK—a single side band modulation scheme. In the preferred embodiment of the invention the programmable VCA circuit 100 is configured in bipolar-complementary metal oxide semiconductor (BiCMOS) technology and comprises a VCA circuit 102, a bias generator 104, and digital to analog converter (DAC) 106. The VCA 102 portion comprises VCA circuitry as known in the art having a gain stage characterized by the exponential equation:

$$Gain = K\{1/(1+e^{VDIFF/Vt})\},$$

where Vt represents a thermal coefficient and K represents an impedance constant.

The bias generator 104 receives an analog voltage, Vcnt, preferably generated by the digital to analog converter (DAC) 106. The DAC 106 takes a digital word, such as produced by a micro-controller (not shown) and converts it to the analog voltage, Vcnt. The control voltage, Vcnt, can vary from 0 to Vcc (supply), however, the linear region is typically in the range of 0 to 1.2 volts. For low voltage monolithic integrated circuits the control voltage, Vcnt, will generally vary between 0 and 1.2 volts in increments, or steps, of 25 millivolts (mV). The use of DAC 106 provides dynamic control over the operation of the programmable VCA circuit 100.

The bias generator 104 includes a bandgap reference 108 and a gain/slope control circuit 110. Briefly, according to the invention, the bandgap reference 108 sets a voltage and current reference for the gain control portion of the gain/slope control circuit 110. The analog voltage, Vcnt, is compared to the reference voltage generated from the bandgap 108 through the gain/slope control circuit 110 and controls the attenuation of the VCA circuit 102. A slope select input is used to control a load resistance of the gain/slope control circuit 110. A differential voltage output, Vdiff, is produced which can then be used to dynamically control VCA 102 for any attenuation regardless of the modulation scheme employed.

Referring to the bias generator circuit 104 in more detail. The bandgap reference 108, preferably comprised of temperature independent comparator circuitry as known in the art, generates the reference voltage and a reference current. The reference current generated by the bandgap 108 provides a temperature independent current source for the gain/slope circuit 110. In the preferred embodiment, the reference voltage is set for 1.2 volts for comparison with the control voltage, Vcnt. When these two voltages are equivalent then equal currents flow through each bipolar transistor pair 136, 138 and a balanced condition is met. Transistors 132, 134 pull current through the diode drops of transistor pairs 136, 138, thus forming first and second variable current sinks controlled by the reference voltage and the control voltage. As the control voltage, Vcnt, varies, an unbalanced current condition is created through the collectors of transistor 140 and 142.

Continuing the slope/gain circuit, 110, a first transistor pair 120 uses the slope select as a gate bias voltage. The slope select, preferably set by a serial peripheral port (SPI) bit, controls the switching of the transistor pair 120. In the preferred embodiment transistor pair 120 is formed of P-channel metal oxide semiconductor field effect transistor (MOSFETS). Transistor pair 120 is responsible, through the switching of resistors 124 and 130, for setting an impedance to control the swing of the gain/slope control circuit 110. Resistors 124, 126 are paralleled and resistors 128, 130 are paralleled when the slope select is low. This presents a lower impedance thus reducing the overall differential signal swing, Vdiff. The slope control, switching transistor pair 120 and load resistors 124–128 are primarily responsible for setting a resistive load impedance, while the control voltage and reference voltage provide the amount of current being pulled through each resistive load, thus generating first and second differential swings for each resistive load.

In the preferred embodiment, the bias generator 104 is programmable through the SPI and the DAC. The DAC controls the attenuation while the SPI controls the dynamic range via the slope. When symmetry is set up, maximum gain is achieved, Vdiff=0 volts, and there is minimum attenuation. As the control voltage, Vcnt, is decreased, an unbalanced current condition is created which in combination with the preset load condition determined by the SPI, generates a differential voltage, Vdiff. This differential voltage causes the exponential response of VCA 102 to attenuate with a predetermined slope.

For example, when the control voltage, Vcnt, is 0 volts and the reference voltage is 1.2 volts an unbalanced structure is created. With a slope select input of a high, Vcc approximately 3 volts, then the differential output, Vdiff, measures approximately 230 mV which provides maximum attenuation to the VCA 102. When the slope select measures low, about 0.1 or 0.2 millivolts (mV), the differential voltage measures approximately 190 mV which provides maximum attenuation with a less steep slope. The larger the differential voltage, the higher the attenuation.

The programmable VCA 100 can be applied to a CDMA and PACS application, where higher attenuation of the VCA 102 is required for the CDMA protocol than for the PACS protocol and where the PACS protocol requires a less steep slope than the CDMA protocol. For CDMA, the SPI bit switches such that a higher differential voltage, Vdiff, is used. For the PACS application, on the other hand, a lower Vdiff is used.

Figure 2:
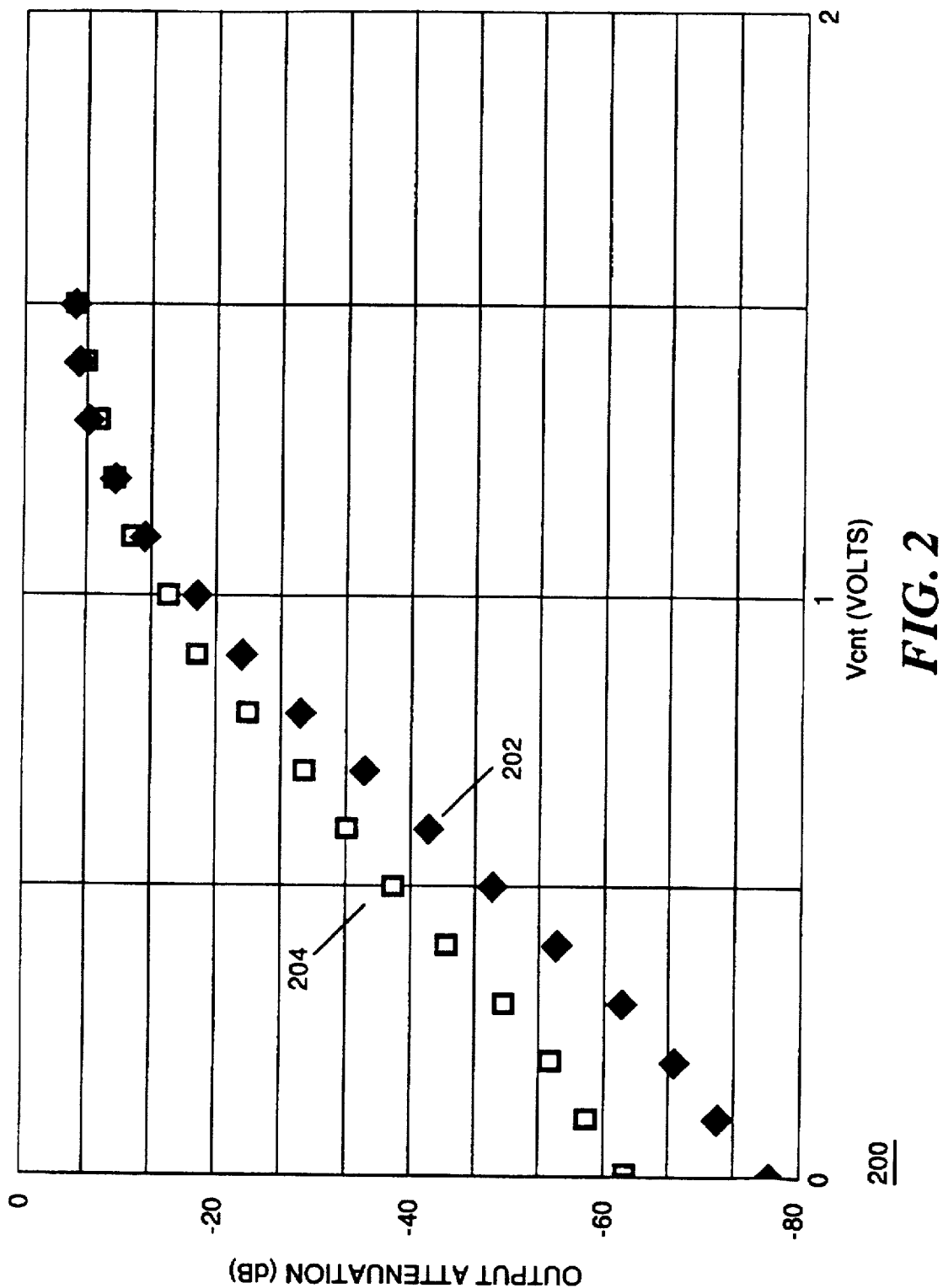
FIG. 2 is a graph comparing the dynamic range and gain of the programmable voltage controlled attenuator circuit in accordance with the present invention.

Referring now to the graph of FIG. 2 there is shown simulated data taken with the programmable voltage controlled attenuator in accordance with the present invention. This particular simulation meets the dynamic range requirements of the CDMA protocol and the attenuation slope requirements of the PACS protocol. The simulated CDMA response is shown by designator 202 while the simulated PACS response is shown by designator 204. The horizontal axis represents the input voltage, Vcnt, such as from a DAC, and ranges from 0 to 1.5 volts. Both responses were achieved in a simulation of a single monolithic integrated circuit employing BiCMOS-technology. By varying the bias to the VCA, the slope was altered and thus the dynamic range of the attenuator was adjusted. Using a slope control bit of 0, the dynamic range measured approximately 56.6 dB with a slope of 41 dB/volt meeting the PACS requirements. A programming SPI bit of 1, which in this simulation translates to 3 volts (the supply voltage, Vcc) provided a dynamic range of approximately 71.4 dB with a slope of 52.5 dB/volt meeting the CDMA requirements. When a low control voltage was used, maximum attenuation was achieved, while a higher voltage provided minimum attenuation. As demonstrated by the graph 200, there is now one control voltage range that can satisfy both protocol requirements within a single circuit.

Figure 3:
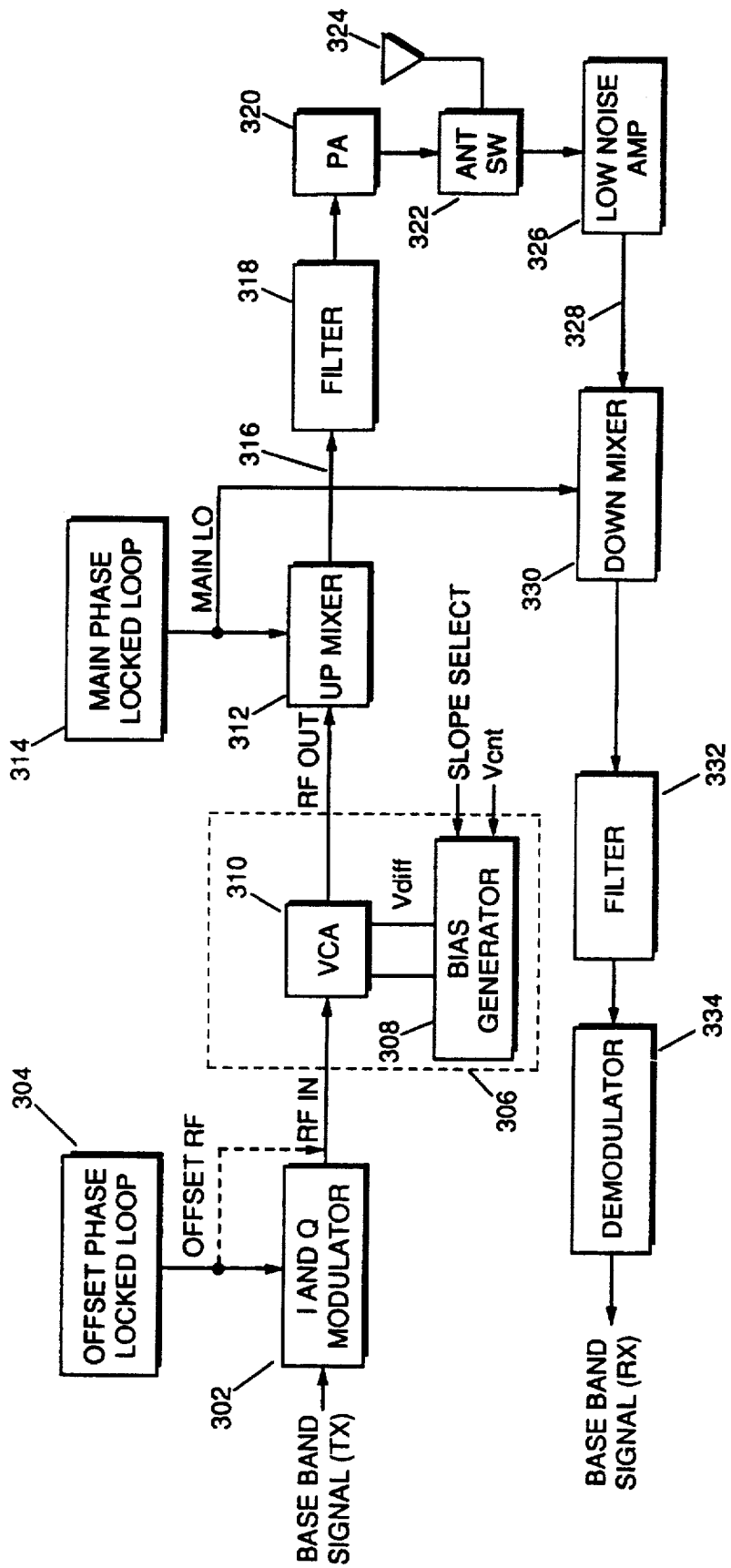
FIG. 3 is a drawing of a radio in accordance with the present invention.

Referring now to FIG. 3 of the accompanying drawings there is shown a radio block diagram 300 in accordance with the preferred embodiment of the invention. Radio 300 includes an I/Q modulator 302 which receives a base band signal which it modulates with an offset RF signal generated from an offset phase locked loop (PLL) 304. The I/Q modulator 302 generates a modulated RF signal, RF IN, and provides this signal to the programmable VCA 306 in accordance with the present invention. The programmable VCA 306 includes bias generator 308 and VCA 310. The bias generator 308 is programmed through a slope select input and control voltage input, Vcnt, to produce a differential voltage, Vdiff, in accordance with a predetermined dynamic range and gain associated with a desired communication protocol, such as CDMA or PACS. The programmable VCA 306 generates an RF output signal with the desired attenuation and slope and provides the RF output signal to an up mixer 312 where it is mixed with a main LO signal generated from a main phase locked loop (PLL) 314 to produce an RF carrier signal 316. The RF carrier signal 316 is then filtered through filter 318, amplified through power amplifier, PA, 320, and switched through antenna switch 322 to an antenna 324 as a transmit carrier output signal.

Still referring to radio 300 and briefly looking at the receive path, a receive signal is received at antenna 324 and switched, via antenna switch 322, through to a low noise amplifier 326. The received signal 328 is then mixed through a down mixer 330 with the main LO signal generated from the main PLL 314 to provide a receive intermediate (IF) frequency. The receive IF signal is then filtered through filter 332 and demodulated through demodulator 334 to produce a receive base band signal which is further translated into audio or data (not shown). Other radio receiver configurations can also be used for the radio 300.

In a second radio embodiment of the invention (not shown) the offset RF signal (a buffered offset LO signal) can be taken directly to the programmable VCA 306 thereby bypassing the I/Q modulator 302. In accordance with the preferred embodiment of the invention, I/Q modulator 302, offset PLL 304, programmable VCA 306, and main phase locked loop 314 are all integrated into a single integrated circuit. The slope select input is preferably controlled by a microprocessor (not shown) while the Vcnt input is preferably controlled by a DAC (not shown). Up mixer 312, and PA 320 represent a wideband amplifier which can be configured using other radio front end circuitry as well. Different filtering and mixing scenarios can be applied without departing from the overall approach of VCA control.

Hence, the programmable VCA circuit as described by the invention, takes a modulated signal, such as generated from an I/Q modulator or a local oscillator (LO) buffer circuit, and attenuates the signal according to the drive input, Vdiff, which is under the control of the bias generator circuit. The bias generator circuit in accordance with the present invention controls the gain and slope of the VCA circuit, through slope and attenuation controls, in order to meet the protocol requirements of various communication systems. Independent differential voltage swings are generated using a single control voltage range and a slope select voltage input. An output signal RF OUT is thus attenuated by the programmable VCA that can now be used to bias circuits such as wideband power amplifiers.

The foregoing describes a programmable VCA employing dual differential voltage swings that can adapt to first and second protocols. One skilled in the art can surmise that the approach as described by the invention can also be used to create a multitude of separate differential voltage swings by increasing the number of switching transistor/resistive load pairs to generate more slope/dynamic range combinations. Hence, the programmable VCA can accommodate a multitude of protocols with independent differential voltage swings to meet the requirements of each protocol.

While the preferred embodiment shows the control voltage as being sourced from a DAC, other voltage sources could also be used. The advantages of using a DAC to control attenuation are that programming algorithms can be used to dynamically control the power output and power cutback of power amplifier circuits, regardless of the modulation schemes used. While the slope select is described as being generated from a SPI bit, other slope select means such as a microprocessor can be used. While shown in BiCMOS technology, other technology such as bipolar or CMOS can also be used to configure the integrated programmable VCA. The programmable VCA circuit 100 as described by the invention allows the protocol to specify attenuation either in terms of attenuation/volt as in PACS systems or simply as an overall dynamic range requirement, such as in CDMA systems. Numerous modifications, changes, variations, substitutions and equivalents will occur to those skilled in the art without departing from the spirit and scope of the present invention as defined by the appended claims.

What is claimed is:

1. An integrated biasing circuit for a voltage controlled attenuator (VCA), comprising:

a bias generator section receiving a slope select input voltage having first and second levels and an attenuation control voltage;

a bandgap reference located within the bias generator section and providing a reference voltage;

a variable resistive load located within the bias generator section and responsive to the slope select input voltage having first and second levels and providing first and second load impedances respectively;

a variable current sink located within the bias generator section and responsive to the attenuation control voltage and the reference voltage; and said first and second load impedances and said variable current sink providing first and second differential voltage swings to the VCA.

2. An integrated biasing circuit for a VCA as described in claim 1, wherein the first differential voltage swing provides a predetermined dynamic range for a first communication protocol while the second differential voltage swing provides a predetermined gain for a second communication protocol.

3. An integrated biasing circuit for a VCA as described in claim 2, wherein the first communication protocol is a code division multiple access (CDMA) protocol and the second communication protocol is a public access communication system (PACS) protocol.

4. A method of controlling dynamic range and gain in an integrated voltage controlled attenuator (VCA) circuit, comprising the steps of:

setting a voltage reference;

generating a control voltage from a digital to analog converter (DAC) operating over a predetermined control voltage range;

providing first and second current sinks using the voltage reference and the control voltage;

providing a variable impedance;

providing a differential voltage using the variable impedance and the first and second current sinks; and supplying the differential voltage to the VCA; and controlling the dynamic range using the variable impedance and controlling the gain using the DAC.

5. A method as described in claim 4, further comprising the steps of:

controlling the variable impedance with a serial peripheral interface port to provide first and second impedances;

providing a first dynamic range and a first gain in response to the control voltage range and the first impedance; and providing a second dynamic range and a second gain in response to the control voltage range and the variable impedance.

6. An integrated programmable voltage controlled attenuator (VCA) circuit, comprising:

a VCA;

a bias generator coupled to the VCA including:

a bandgap reference providing a reference voltage;

a gain/slope control section for receiving a control voltage and comparing said control voltage to said reference voltage to generate first and second current sinks, the gain/slope control section also including a variable impedance, said variable impedance being responsive to a slope select input, said variable impedance and said first and second current sinks providing a differential voltage to the VCA; and said control voltage operates over a predetermined range, said predetermined range and said slope select input providing first and second predetermined differential voltage swings to the VCA.

7. An integrated programmable VCA circuit as described in claim 6, wherein the gain/slope control section comprises a switching transistor pair including resistive loads coupled through diode drops to a differential transistor pair, said differential transistor pair biased by the reference voltage and the control voltage, and said switching transistor pair biased by the slope select input.

8. An integrated programmable VCA circuit as described in claim 7 wherein the differential transistor pair comprises N-channel metal oxide field effect transistors (MOSFETs) and the switching transistor pair comprises P-channel MOSFETs, and the diode drops comprise bipolar npn transistors.

9. A radio, comprising:

an offset phase locked loop (PLL) for generating an offset radio frequency (RF) signal;

a modulator for receiving a base band signal and modulating said base band signal with said offset RF signal and generating a modulated RF signal;

a programmable voltage controlled attenuator (VCA) for receiving the modulated RF signal and providing an attenuated modulated RF signal;

said programmable VCA including, a bias generator having a slope control input and a control voltage range input for providing a predetermined number of differential voltage swings, each differential voltage swing providing a predetermined slope and dynamic range for a predetermined number of communication protocols, said programmable VCA also including a VCA for receiving each differential voltage swing and biasing said modulated RF signal using each predetermined voltage swing; and a wideband amplifier for receiving the attenuated modulated RF signal and generating an RF carrier signal.

* * * * *

UNITED STATES PATENT AND TRADEMARK OFFICE
CERTIFICATE OF CORRECTION

PATENT NO. : 5,703,909
DATED : December 30, 1997
INVENTOR(S) : Fang et al.

It is certified that error appears in the above-indentified patent and that said Letters Patent is hereby corrected as shown below:

Title Page

Item [57] Abstract
In the last line of the abstract, please replace "(109)" with (102)--.

Signed and Sealed this

Third Day of March, 1998

*Attest:*

BRUCE LEHMAN

*Attesting Officer*    Commissioner of Patents and Trademarks